United States Patent [19]

Komuro

[11] Patent Number: 5,399,906
[45] Date of Patent: Mar. 21, 1995

[54] HIGH-FREQUENCY HYBRID SEMICONDUCTOR INTEGRATED CIRCUIT STRUCTURE INCLUDING MULTIPLE COUPLING SUBSTRATE AND THERMAL DISSIPATOR

[75] Inventor: Katsuya Komuro, Itami, Japan

[73] Assignee: Mitsubishi Denki Kabushiki Kaisha, Tokyo, Japan

[21] Appl. No.: 953,706

[22] Filed: Sep. 30, 1992

[30] Foreign Application Priority Data

Oct. 1, 1991 [JP] Japan .................................. 3-253834

[51] Int. Cl.$^6$ ...................... H01L 23/02; H01P 1/00; H05K 7/02
[52] U.S. Cl. ........................... 257/705; 257/712; 257/713; 257/718; 257/719; 333/246; 333/247; 361/688; 361/692; 361/704; 361/709; 361/711; 361/713; 361/714
[58] Field of Search ............... 257/705, 758, 774, 720, 257/719, 712, 713, 718; 333/246, 247; 361/688, 692, 690, 709, 711, 712, 713, 714, 736

[56] References Cited

U.S. PATENT DOCUMENTS

| | | |
|---|---|---|
| 4,811,166 | 3/1989 | Alvarez et al. .................... 257/720 |
| 5,235,211 | 8/1993 | Hamburgen ....................... 257/758 |

Primary Examiner—Andrew J. James
Assistant Examiner—Carl Whitehead, Jr.
Attorney, Agent, or Firm—Leydig, Voit & Mayer

[57] ABSTRACT

A high-frequency semiconductor hybrid integrated circuit device with desirable high-frequency properties and reduced floating capacitance that is easily manufactured at lower cost with reduced labor. A coupling dielectric substrate bearing conducting films as a circuit pattern is joined to a main dielectric substrate mounted on a heat radiating plate and bearing elements for high frequency amplification to a heat sink. The coupling dielectric substrate should have the same circuit constants at the high-frequency circuit as the main dielectric substrate.

7 Claims, 6 Drawing Sheets

HIGH-FREQUENCY HYBRID SEMICONDUCTOR INTEGRATED CIRCUIT STRUCTURE INCLUDING MULTIPLE COUPLING SUBSTRATE AND THERMAL DISSIPATOR

BACKGROUND OF THE INVENTION

1. Field of the Invention

The present Invention relates to a high-frequency semiconductor hybrid integrated circuit device comprising a high-frequency circuit Including a transistor for amplifying a high-frequency electric power, and a peripheral circuit, such as a matching circuit, for the high-frequency circuit.

2. Description of the Related Art

FIG. 6 is a perspective view showing a discrete transistor mounting portion of a conventional high-frequency semiconductor hybrid integrated circuit device. In FIG. 6, a dielectric substrate 2 is adhered to the heat radiating plate 1 by soldering. The dielectric substrate 2 has a peripheral circuit 50 shown in phantom lines including a matching circuit for a high-frequency circuit. The dielectric substrate 2 further includes a hole 2a for mounting a heat sink 3 on which a discrete transistor is mounted. The heat sink 3 is formed of an insulating material having a desirable heat conductivity (low heat resistance). A MOS-type capacitor 4 and a transistor chip 5 are mounted on the heat sink 3.

An input conductive film 6a and an output conductive film 7a are printed on the dielectric substrate 2, while an input conductive film 6b and an output conductive film 7b are printed on the heat sink 3. The output conductive film 7a also acts as a bias line for the transistor chip 5. Further, grounding conductive films 8a and 8c are printed on the surface of the heat sink 3. The input lead 12 is coupled to the input conductive films 6a and 6b while the output lead 13 is coupled to the output conductive films 7a and 7b, and both of leads 12 and 13 are fixed to the conductive films by soldering. The input lead 12, the MOS-type capacitor 4 on the ground conductive film 8c, a ground conductive bridge 14, and the transistor chip 5 on the output conductive film 7b are coupled through bonding wires 11 composed of e.g. Au.

For a simple description of the operation of the device, the high-frequency power is applied to the transistor chip 5 through the input conductive film 6a, the input lead 12, the input conductive film 6b, the bonding wire 11, and the MOS-type capacitor 4. The input high-frequency power is amplified in the transistor chip 5. The amplified high-frequency power is then output through the output conductive film 7b, output lead 13, and the output conductive film 7a. The heat generated by the amplifying operation flows out of the integrated circuit device through the heat sink 3 and the heat radiating plate 1.

A conventional high-frequency semiconductor hybrid integrated circuit has been composed as mentioned above. In a high-frequency circuit, it is desirable for obtaining excellent high-frequency characteristics, in particular, to form a so-called uniformly distributed constant line path in which the constants of resistance, inductance, and capacitance are uniformly distributed along a line path. However, in the conventional device, a significant floating capacitance is produced at the input lead 12 and the output lead 13, which greatly differs from the capacitance at the input/output conductive films 6a, 6b, 7a and 7b, thereby causing the circuit constant along the line path to be non-uniform. This worsens the high-frequency characteristics of the high-frequency circuit. FIG. 7 is an equivalent circuit showing a distribution of the circuit constants of a input line path around the input conductive films 6a and 6b and the input lead 12 in FIG. 6. This equivalent circuit is composed of a plurality of inductances La (the resistance component is omitted), and capacitances Ca and C12 between these conductive films 6a, 6b and the heat radiating plate at the ground level. Thus, in the conventional device, the stray capacitance at the input lead 12, i.e., the capacitance C12, was larger than that at the input conductive films 6a and 6b i.e., the capacitance Ca. The same is true at the output lead 13 side.

Further, in the manufacturing process of such a conventional device, a fitting process for the input/output leads 12, 13 and the ground bridge 14 etc. is required, therefore it is difficult to save labor.

Furthermore, since the heat sink 3 for mounting the discrete transistor is square, it is necessary to form the hole 2a of the dielectric substrate 2 a in square shape which causes stress to concentrate at the corners of the hole 2a, thereby cracking the substrate 2.

SUMMARY OF THE INVENTION

It is therefore an object of the present invention to provide a high-frequency semiconductor hybrid integrated circuit having an excellent high-frequency characteristics, saving labor in the manufacturing process, and preventing the dielectric substrate from cracking.

According to the present invention, a high-frequency semiconductor hybrid integrated circuit comprises: a heat sink having at least one circuit element mounted thereon for high-frequency amplification and radiating a large amount of heat; a main dielectric substrate having a peripheral high-frequency current mounted thereon, said heat sink being mounted at a part thereof; a heat radiating plate on which said heat sink and the main dielectric substrate are mounted; a dielectric substrate having a coupling surface for making an electrical connection between said heat sink and said main dielectric substrate and adhered to both, and a grounded surface extending over almost all the surface opposite to the coupling surface; a bonding wire for making electrical connection to the circuit element in said heat sink; grounding means for grounding said heat radiating plate, said main dielectric substrate, said coupling dielectric substrate, and the grounded surface of said coupling dielectric substrate.

Further, the present invention includes a method for manufacturing above-mentioned integrated circuit device.

In the high-frequency semiconductor hybrid integrated circuit device according to the present invention, since the electrical coupling between the main dielectric substrate and the heat sink is made by adhering the coupling dielectric substrate thereto, the circuit constant along the line of the high-frequency circuit become uniform. Also, the electrical coupling between the main dielectric substrate and the heat sink can be made by joining the coupling dielectric substrate to both of them and then wire bonding the circuit elements on the heat sink. Therefore, it becomes unnecessary to mount the input/output leads and earthed bridge conventionally used, thereby realizing a saving on labor.

In addition, if the heat sink and the hole portion in the main dielectric substrate for receiving the heat sink have no corners, the main dielectric substrate can be prevented from cracking.

The above and other advantages, features and additional objects of the present invention will be manifest to those versed in the art upon making reference to the following detailed description and the accompanying drawings in which the structural embodiment incorporating the principles of the present invention is shown by way of illustrative example.

DETAILED DESCRIPTION OF THE PREFERRED EMBODIMENTS

An embodiment of the present invention will now be described with reference to the accompanying drawings.

Figure 1:
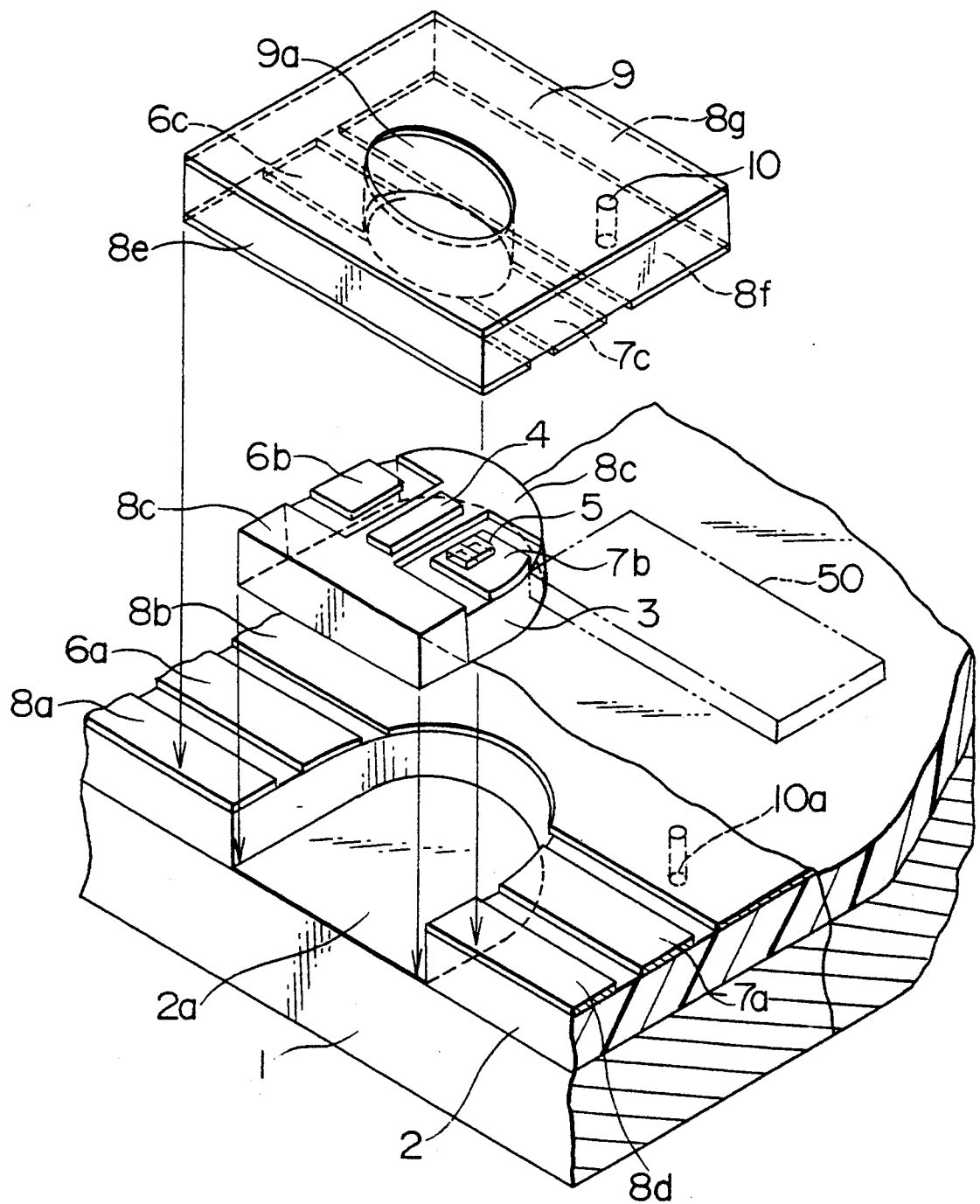
FIG. 1 is an exploded perspective view of a high-frequency semiconductor hybrid integrated circuit device according to an embodiment of the present invention.

FIG. 1 is a perspective view showing a discrete transistor mounting portion of a high-frequency semiconductor hybrid integrated circuit device according to an embodiment of the present invention. In FIG. 1, the components that are the same as or correspond to those of the conventional device are designated by the same numerals. A heat sink 3 mounting the discrete transistor is composed of an insulating material having a low heat resistance (e.g. BeO). On the upper surface (mounting surface) are an input conductive film 6b, an output conductive film 7b and a grounding conductive film 8c formed as a circuit pattern by the photolithographic technique (printing) are present. A MOS-type capacitor 4 and an amplifying transistor chip 5 as high-frequency amplification circuit elements radiating a large amount of heat are also mounted on the heat sink 3. The grounding conductive film 8c extends over the side surface of the heat sink 3 toward the lower surface for electrical connection to the heat radiating plate 1.

A high-frequency peripheral circuit 50 shown by phantom lines is mounted on the upper surface i.e., the mounting surface, of the main dielectric substrate 2. Also, as a circuit pattern, an input conductive film 6a, an output conductive film 7a and ground conductive film 8a, 8b, and 8d are printed on the upper surface of the main dielectric substrate 2. An hole 2a passing through the upper and lower surfaces of the main dielectric substrate 2 is formed for receiving the heat sink 3 therein. The portion of the heat sink 3 placed in contact with the dielectric substrate is formed without corners to prevent the substrate from cracking, and the hole 2a formed in the main dielectric substrate 2 is shaped to correspond thereto. The heat sink 3 and the main dielectric substrate 2 have the same thickness. The ground conductive films 8a, 8b and 8d are coupled to the heat radiating plate 1 through a via hole 10a.

The heat radiating plate 1 is fused or soldered to the lower surfaces of the heat sink 3 and the main dielectric substrate 2 respectively and radiates the heat generated by these elements.

A small coupling dielectric substrate 9 provides electrical connections between the main dielectric substrate 2 and the heat sink 3. On the lower surface (joint surface) of the substrate 9, an input conductive film 6c, an output conductive film 7c and ground conductive films 8e, and 8f are a circuit pattern which is directly soldered to the corresponding conductive films of the main dielectric substrate 2 and the heat sink 3. A ground conductive film 8g covers almost the entire upper surface (ground surface) of the substrate 9. The input conductive film 6c is joined to the input conductive film 6a on the main dielectric substrate 2 and the input conductive film 6b on the heat sink 3. The output conductive film 7c is joined to the output conductive film 7b on the heat sink 3 and the output conductive film 7a on the main dielectric substrate 2. The ground conductive film 8e is joined to the ground conductive films 8a and 8d on the main dielectric substrate 2, and to the ground conductive film 8c on the heat sink 3. The ground conductive film 8f is joined to the ground conductive film 8b on the main dielectric substrate 2 and to the ground conductive film 8c on the heat sink 3. Further, the ground conductive film 8f on the lower surface and the ground conductive film 8g on the upper surface are mutually electrically connected by a via hole 10.

At the center of the coupling dielectric substrate 9, a through hole 9a passing through the upper/lower surfaces of the substrate 9 is formed for receiving the MOS-type capacitor 4 and the transistor chip 5 mounted on the heat sink 3, and for providing wire bonding for these elements.

For more uniform circuit constants along the line path of the high-frequency circuit, it is desirable to make the circuit constants of each conductive film of the coupling dielectric substrate 9 equal to that of the main dielectric substrate 2. For instance, the coupling dielectric substrate 9 may be the same material and the same thickness as the main dielectric substrate 2. The ground means is composed of the through holes 10 and 10a.

Figure 2:
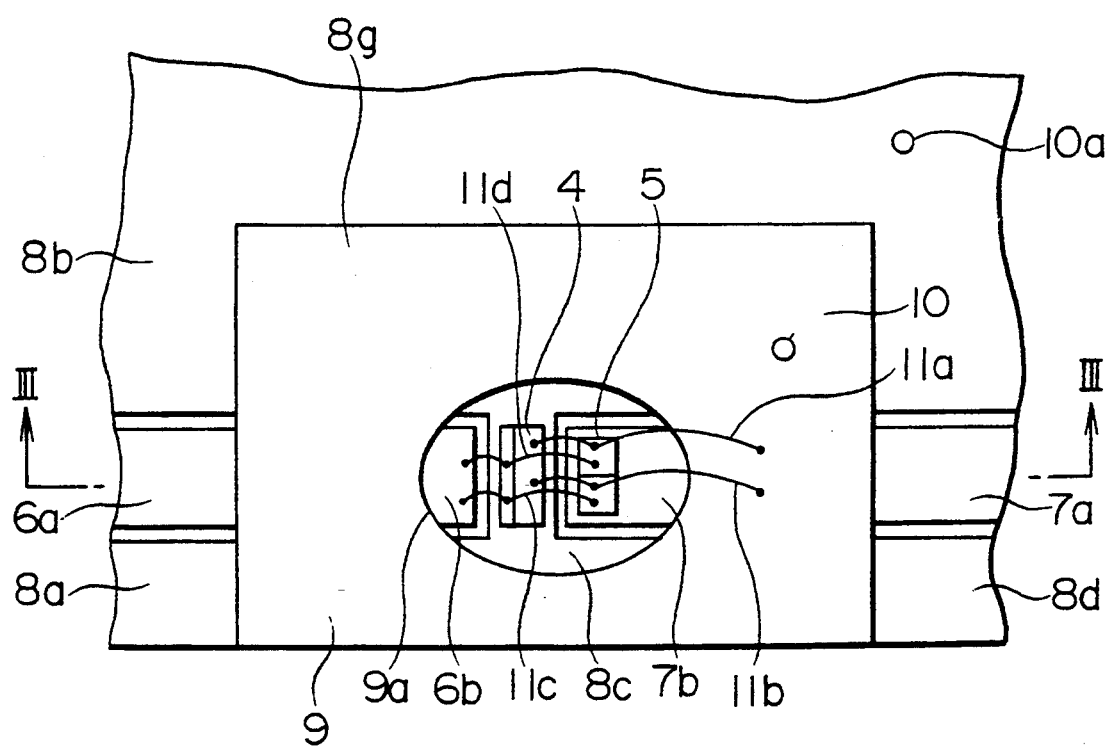
FIG. 2 is a plan view showing the high-frequency semiconductor hybrid integrated device of FIG. 1.
Figure 3:
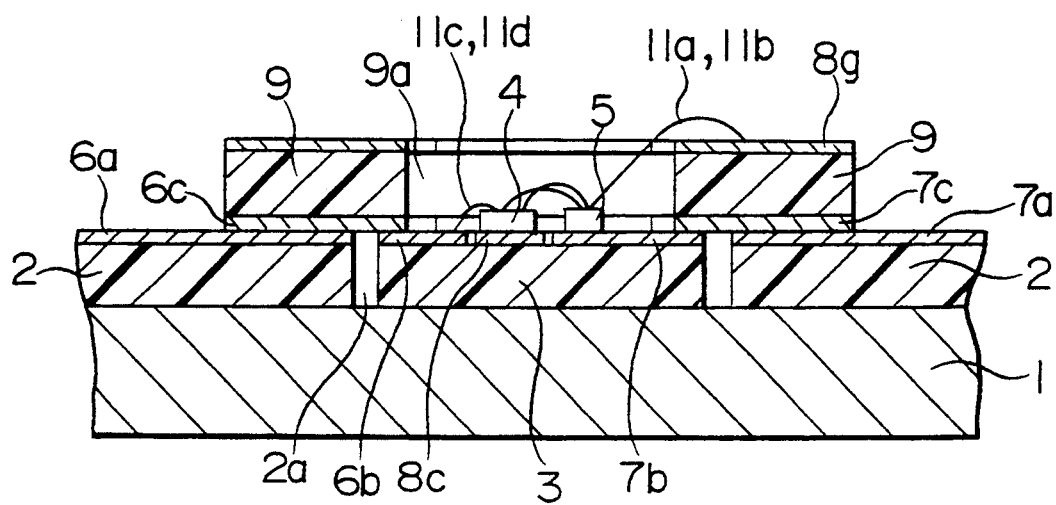
FIG. 3 is a cross-sectional view taken along line III—III of FIG. 2.

FIG. 2 is a plan view of the high-frequency semiconductor hybrid integrated circuit device shown in FIG. 1, while FIG. 3 is a cross-sectional view along a line III—III in FIG. 2. In these FIGS, bonding wires 11a–11d are made of Au. The bonding wires 11a and 11b couple the transistor chip 5 and the MOS-type capacitor 4 to the ground conductive film 8g at the upper surface of the coupling dielectric substrate 9, while the bonding wires 11c and 11d couple the transistor chip 5 and the MOS-type capacitor 4 to the input conductive film 6b on the heat sink 3 for inputting high-frequency power.

According to the high-frequency semiconductor hybrid integrated circuit device of the present invention, first the main dielectric substrate 2 is soldered on the heat radiating plate 1, and next the heat sink 3 on which the MOS-type capacitor 4 and the transistor chip 5 are die-bonded is in the same manner soldered on the main dielectric substrate 2 (first joining process). Further, the coupling dielectric substrate 9 is soldered to the main dielectric substrate 2 and to the heat sink 3 (second joining process). Then, the MOS-type capacitor 4, the transistor chip 5 to a predetermined conductive film are connected in a wire bonding process. Therefore, according to the present invention, coupling leads for coupling the substrate 2 to the heat sink 3 and the coupling bridge need not be mounted separately and individually, as had been required in the conventional device. As a result, the number of components can be reduced and the labor for mounting in the manufacturing process.

On the other hand, in such a high-frequency semiconductor hybrid integrated circuit device as mentioned above, the high-frequency electric power is input to the transistor chip 5 in the order of input conductive films 6a→6c→6b→ bonding wires 11c and 11d→MOS-type capacitor 4→bonding wires 11a and 11b. In the transistor chip 5, the high-frequency electric power is amplified, and thus amplified power is output through the output conductive films in order of 7b→7c→7a. The heat generated by the high-frequency power amplifying operation in the transistor chip 5 flows out of the device through the heat sink 8 and the heat radiating plate 1.

Figure 4:
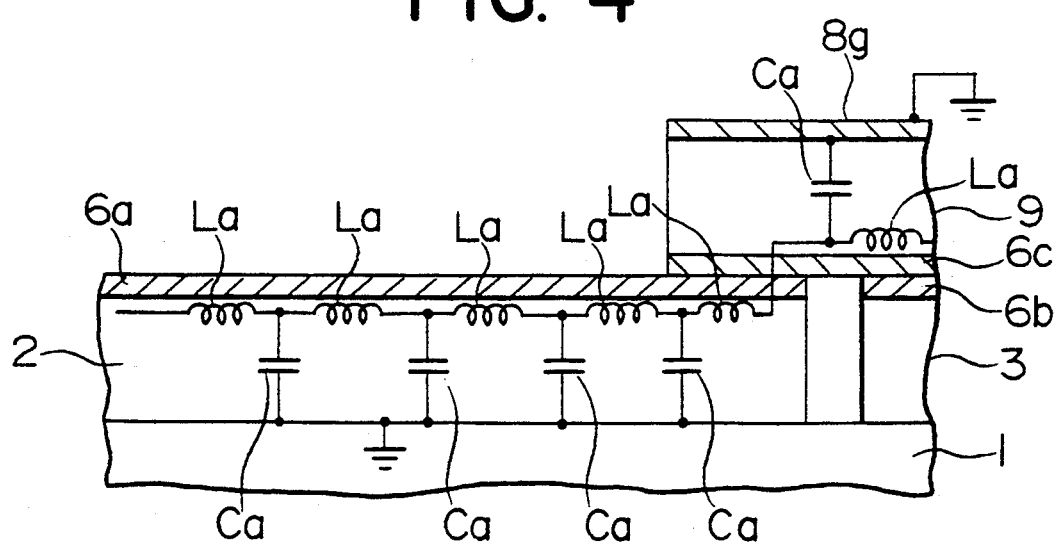
FIG. 4 is an equivalent circuit diagram for the explanation of the distribution of the circuit constant at the input line path of the high-frequency semiconductor hybrid integrated circuit device of FIG. 1.

FIG. 4 is an equivalent circuit showing a distribution of the circuit constants of the input line path near the input conductive films 6a, 6c and 6b of the main dielectric substrate 2, the coupling dielectric substrate 9 and the heat sink 3, respectively, shown in FIGS. 1-3. This equivalent circuit is composed of a plurality of inductances La (the resistance component is omitted) connected in series which correspond to the input conductive films 6a, 6c and 6b, and a capacitance Ca produced between these conductive films and the heat radiating plate 1 or the ground conductive film 8g at ground level. As shown in FIG. 4, the stray capacitance represented by the capacitance Ca at the coupling dielectric substrate 9 is ideally the same as that at the main dielectric substrate 2 so as to make the circuit constants along the line path become more uniform. The same is true in the line path of the output side of the output conductive films 7a, 7c and 7b (see FIG. 3). Accordingly, it is possible to obtain improved and more and stable high-frequency characteristics in comparison with the conventional device.

In the above-mentioned embodiment, the heat sink 3 on which the discrete transistor is mounted has a semi-elliptical shape. However, any other design which has no corners in contact with the main dielectric substrate can also be used. Further, although in the shown embodiment the heat sink 3 is mounted at the end of the main dielectric substrate 2, it can also be mounted at the center of the main dielectric substrate 2. Also in this case, the heat sink 3 and the hole portion 2a formed in the main dielectric substrate 2 for receiving it should have no corners to prevent the substrate 2 from cracking.

Figure 5A:
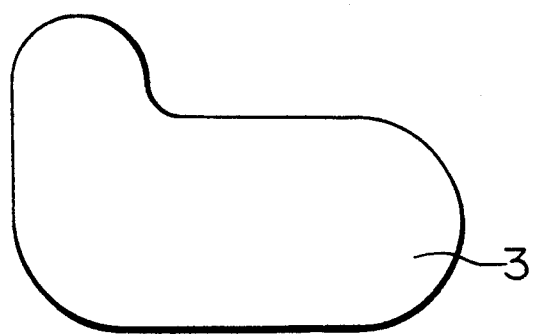
FIGS. 5a–5c shows an example of the configuration of a heat sink according to another embodiment of the present invention.
Figure 5B:
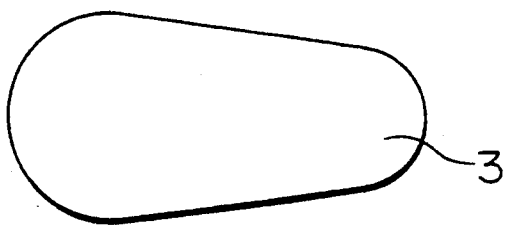
Figure 5C:
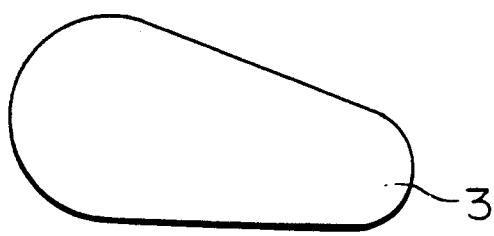
Figure 6:
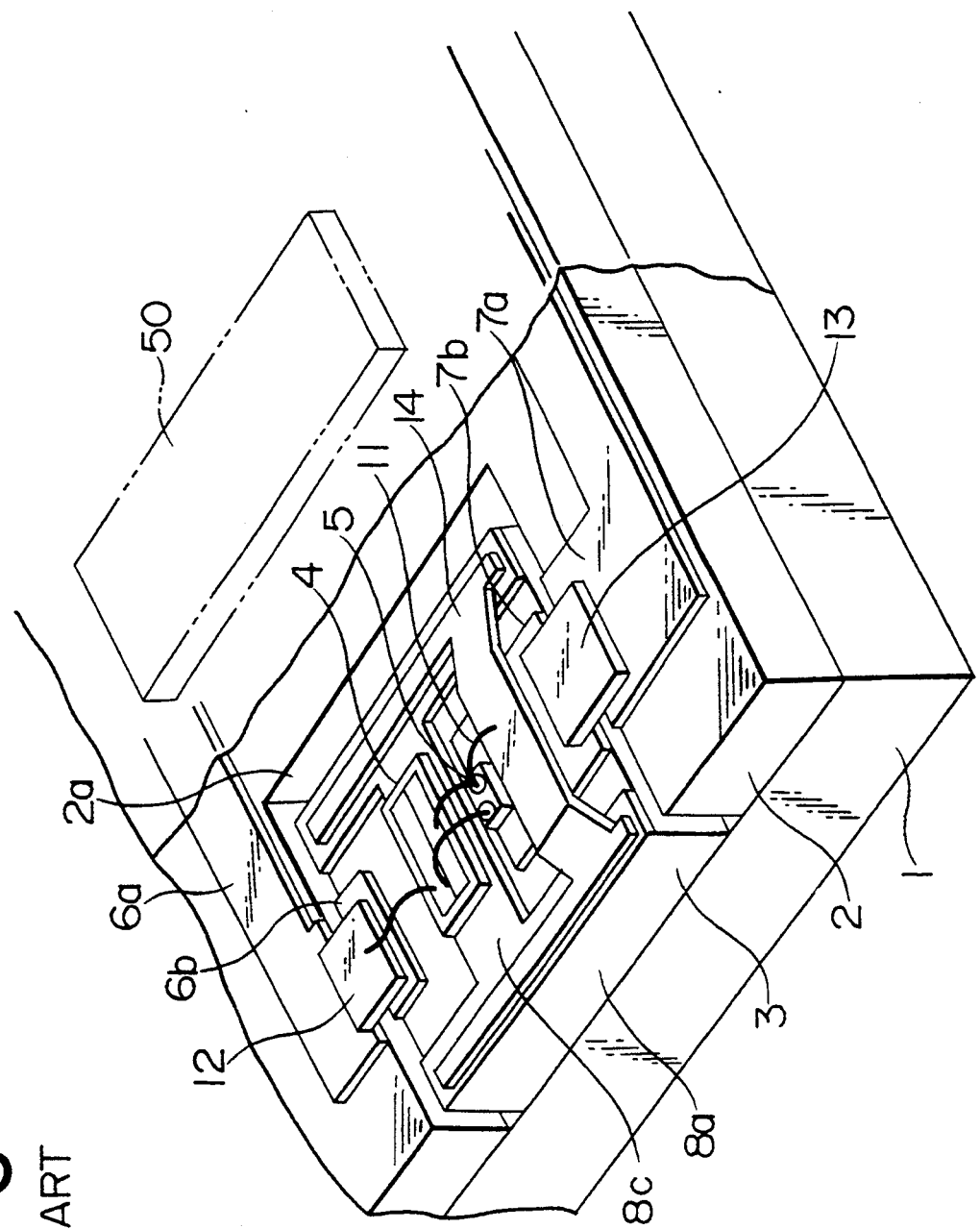
FIG. 6 is a perspective view showing a conventional high-frequency semiconductor hybrid integrated circuit device.
Figure 7:
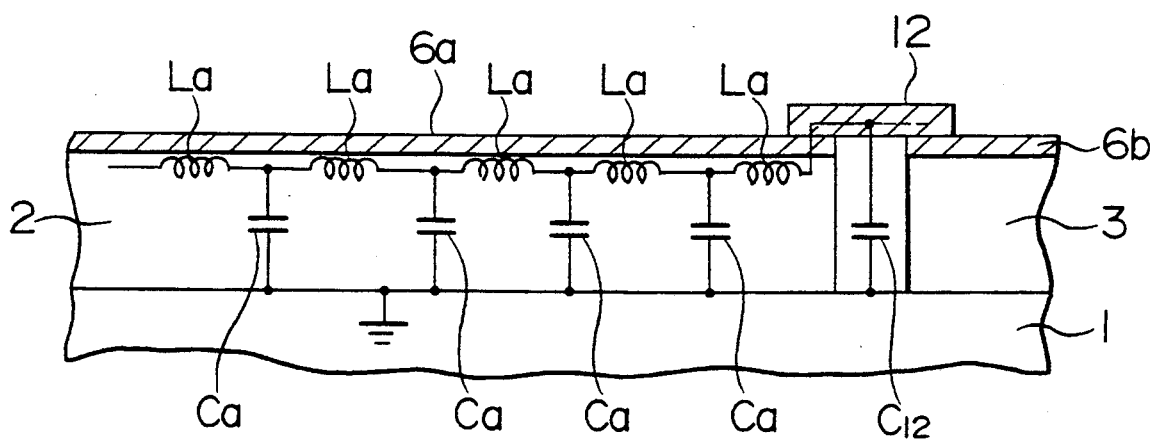
FIG. 7 is an equivalent circuit for the explanation of the distribution of the circuit constants at the input line path of the high-frequency semiconductor hybrid integrated circuit device of FIG. 6.

The high-frequency characteristics vary depending on the position of the heat sink 3 in the hole portion 2a of the main dielectric substrate 2. Therefore, the configurations of the hole portion 2a and the heat sink 3 should be such that the heat sink can always be located at the same position therein. In this manner, the heat sink 3 can easily be soldered, while the undesirable variation of the high-frequency properties between the manufactured devices can be minimized. FIGS. 5A-5C shows examples of the heat sink shapes 3 capable of providing above-mentioned advantages.

As mentioned above, according to the present invention, since the electrical coupling between the main dielectric substrate mounted on the heat radiating plate and the heat sink mounting is made by means of a coupling dielectric substrate such that the circuit constants of the line path of the high-frequency circuit is the same as that of the main dielectric substrate, it is possible to provide more uniform circuit constants along the line path of the high-frequency circuit, to provide improved high-frequency characteristics, and to provide a high-frequency semiconductor hybrid integrated circuit device at lower cost due to labor savings in the manufacturing process. Further, the substrate can be prevented from cracking by forming the heat sink and the hole of the main dielectric substrate without corners.

What is claimed is:

1. A high-frequency semiconductor hybrid integrated circuit device comprising:

a heat sink, formed of an electrically insulating material, having a lower surface and an upper surface as a mounting surface, a thickness between said lower and upper surfaces, at least one circuit element for high-frequency amplification mounted on said mounting surface, and a conductive circuit pattern film on said mounting surface;

a main dielectric substrate having the same thickness as said heat sink, a lower surface and an upper surface as a mounting surface, a peripheral high-frequency circuit, and a conductive circuit pattern film on said dielectric substrate mounting surface, said main dielectric substrate including a hole passing through the upper and lower surfaces and receiving said heat sink;

a heat radiating plate to which said heat sink and said main dielectric substrate are directly mounted;

a coupling dielectric substrate including a lower surface, a conductive circuit pattern film on said lower surface electrically connecting the conductive circuit pattern films on said heat sink and said main dielectric substrate to each other, an upper surface electrically connected to the lower surface of said coupling substrate, a conductive film electrically connected to and almost entirely covering said lower surface of said coupling substrate, and a through hole passing through said upper and lower surfaces receiving said circuit element on said heat sink, the circuit constants of said conductive film and of the conductive circuit pattern film on said main dielectric substrate being almost the same, and said lower surface of said coupling substrate contacting and being electrically connected to said upper surfaces of said heat sink and said main dielectric substrate;

a bonding wire electrically connecting said conductive circuit pattern film and said circuit element mounted on said heat sink; and grounding means for grounding the upper surface and the lower surface of said main dielectric substrate and the upper surface and the lower surface of said coupling dielectric substrate.

2. The high-frequency semiconductor hybrid integrated circuit device according to claim 1 wherein said coupling dielectric substrate is the same material as said main dielectric substrate and has a thickness between said upper and lower surfaces of said coupling dielectric substrate that is the same as said main dielectric substrate such that circuit constants of the conductive circuit pattern film on said coupling dielectric substrate are substantially the same circuit constants of the conductive circuit pattern film on said main dielectric substrate.

3. The high-frequency semiconductor hybrid integrated circuit device according to claim 2 wherein said heat sink and said hole in said main dielectric substrate receiving the heat sink each have a shape free of corners for preventing cracking of said main dielectric substrate.

4. The high-frequency semiconductor hybrid integrated circuit device according to claim 2 wherein said heat sink and said hole in said main dielectric substrate are respectively free of corners to prevent cracking of said substrate and to hold the heat sink in the hole at a predetermined position.

5. A high-frequency semiconductor hybrid integrated circuit device comprising:
 a heat sink;
 at least one circuit element for high-frequency amplification mounted on said heat sink;
 a main dielectric substrate including a peripheral high-frequency circuit;
 a heat radiating plate to which said heat sink and said main dielectric substrate are directly mounted;
 a coupling dielectric substrate having opposed first and second surfaces, an electrically coupling film on the first surface, and an electrically conducting grounding film extending over almost all of the second surface, said coupling film contacting said heat sink and said main dielectric substrate, electrically connecting said heat sink and said main dielectric substrate;
 a bonding wire electrically connected to said circuit element; and
 grounding means for grounding said heat radiating plate, main dielectric substrate, coupling dielectric substrate, and said grounding film.

6. The high-frequency semiconductor hybrid integrated circuit device according to claim 1 wherein said heat sink and said main dielectric substrate are coplanar.

7. The high-frequency semiconductor hybrid integrated circuit device according to claim 5 wherein said heat sink and said main dielectric substrate are coplanar.

* * * * *